(12) United States Patent
Fu

(10) Patent No.: US 11,205,687 B2
(45) Date of Patent: Dec. 21, 2021

(54) DISPLAY PANEL SOLVING LIGHT DIFFRACTION PROBLEM AND MANUFACTURING METHOD THEREOF

(71) Applicant: Shanghai Tianma Micro-Electronics Co., Ltd., Shanghai (CN)

(72) Inventor: Jujian Fu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 4 days.

(21) Appl. No.: 16/853,707

(22) Filed: Apr. 20, 2020

(65) Prior Publication Data

US 2020/0251542 A1 Aug. 6, 2020

(30) Foreign Application Priority Data

Dec. 3, 2019 (CN) .......................... 201911223241.1

(51) Int. Cl.
*H01L 25/16* (2006.01)
*H01L 27/32* (2006.01)

(52) U.S. Cl.
CPC ........ *H01L 27/3246* (2013.01); *H01L 25/167* (2013.01); *H01L 27/3258* (2013.01); *H01L 27/3211* (2013.01); *H01L 2227/323* (2013.01); *H01L 2251/558* (2013.01)

(58) Field of Classification Search
CPC ............... H01L 27/3246; H01L 25/167; H01L 27/3258; H01L 27/3211; H01L 2227/323; H01L 2251/558

USPC ........................................ 257/40; 438/82, 99
See application file for complete search history.

(56) References Cited

U.S. PATENT DOCUMENTS

| 2016/0380038 | A1* | 12/2016 | Kang | ................... | H01L 27/3246 |
| | | | | | 257/40 |
| 2017/0207285 | A1* | 7/2017 | You | ..................... | H01L 51/5215 |
| 2017/0213873 | A1* | 7/2017 | Bok | ...................... | G06F 3/0443 |
| 2017/0221976 | A1* | 8/2017 | Park | ..................... | H01L 27/3246 |
| 2019/0363279 | A1* | 11/2019 | Yamaguchi | ......... | H01L 51/5253 |

FOREIGN PATENT DOCUMENTS

CN 204651324 U 9/2015

* cited by examiner

*Primary Examiner* — Didarul A Mazumder
(74) *Attorney, Agent, or Firm* — Kilpatrick Townsend & Stockton, LLP

(57) ABSTRACT

Provided are a display panel, a display device and a manufacturing method. The display panel includes a display area, the display area includes a transparent display region, where the transparent display region includes multiple transparent regions arranged in an array manner and multiple light-emitting regions disposed between adjacent transparent regions; a substrate; and multiple first light-emitting elements located on one side of the substrate and in the multiple light-emitting regions. In the transparent display region, film layers in at least two adjacent transparent regions have different thicknesses, and/or the film layers in the at least two adjacent transparent regions are made of different materials.

19 Claims, 12 Drawing Sheets

DISPLAY PANEL SOLVING LIGHT DIFFRACTION PROBLEM AND MANUFACTURING METHOD THEREOF

CROSS-REFERENCES TO RELATED APPLICATIONS

This application claims the priority to a Chinese patent application No. CN201911223241.1 filed at the CNIPA on Dec. 3, 2019, disclosure of which is incorporated herein by reference in its entirety.

FIELD

The present disclosure relates to the field of display techniques and, in particular, to a display panel, a display device and a manufacturing method.

BACKGROUND

An organic light-emitting diode (OLED) display is a self-emissive display that displays images through OLEDs used for emitting light. The OLED display has the features of a high brightness, a wide material selection range, a low driving voltage, full-curing active light emission and the like, and has the advantages of a high definition, a wide viewing angle, a high response speed and the like.

The OLED display uses emitted light to display images, and may further be made into a transparent display device that allows a user to view objects or images located on an opposite side of the OLED display. Generally, the transparent display device includes multiple evenly distributed transparent regions so that light from the opposite side of the transparent display device passes through the transparent regions. However, the light is diffracted when passing through the transparent regions and affects the displaying of the transparent display device, distorting the displaying of the OLED display.

SUMMARY

Embodiments of the present disclosure provide a display panel, a display device and a manufacturing method to solve the light diffraction problem in a transparent region of a display panel that affects the display effect of the display panel.

One embodiment of the present disclosure provides a display panel. The display panel includes a display area, a substrate and multiple first light-emitting elements.

The display area includes a transparent display region, where the transparent display region includes multiple transparent regions distributed in an array and multiple light-emitting regions disposed between adjacent transparent regions.

The multiple first light-emitting elements are located on one side of the substrate, and the multiple first light-emitting elements disposed in the multiple light-emitting regions.

In the transparent display region, film layers in at least two adjacent transparent regions have different thicknesses, and/or the film layers in the at least two adjacent transparent regions are made of different materials.

Another embodiment of the present disclosure provides a display device. The display device includes the display panel according to any embodiment of the present disclosure and a photosensor.

The photosensor is disposed with respect to the transparent display region of the display panel.

In yet another embodiment of the present disclosure further provides a manufacturing method of a display panel. The method includes the steps described blow.

A substrate including a display area is provided, where the display area includes a transparent display region and the transparent display region includes multiple transparent regions distributed in an array and multiple light-emitting regions disposed between adjacent transparent regions.

Multiple first light-emitting elements are formed on the substrate, where the multiple first light-emitting elements are disposed in the multiple light-emitting regions.

Multiple film layers stacked are formed on the substrate.

In the transparent display region, film layers in at least two adjacent transparent regions have different thicknesses, and/or the film layers in the at least two adjacent transparent regions are made of different materials.

In the present disclosure, the display area of the display panel includes the transparent display region, where the transparent display region includes the multiple transparent regions distributed in an array and the multiple light-emitting regions disposed between the adjacent transparent regions for the purpose of transparent display, so that a user can view objects or images on a non-emissive side of the display panel. Specifically, the multiple first light-emitting elements are disposed on one side of the substrate and in the multiple light-emitting regions for the purpose of light emission and display. In the transparent display region, film layers in the at least two adjacent transparent regions have different thicknesses or are made of different materials, or film layers in the at least two adjacent transparent regions have different thicknesses and are made of different materials. Thus, an optical path or a phase difference can be adjusted when external light passes through adjacent transparent regions, so that the multiple transparent regions arranged in an array do not form a fixed grating. Then, it is difficult for the multiple transparent regions to diffract the external light for the reason of the periodic arrangement when the external light passes through the multiple transparent regions, enhancing the stability of the light-transmitting display of the display panel, preventing the display distortion of the display panel and enhancing the display effect.

DETAILED DESCRIPTION

Figure 1:
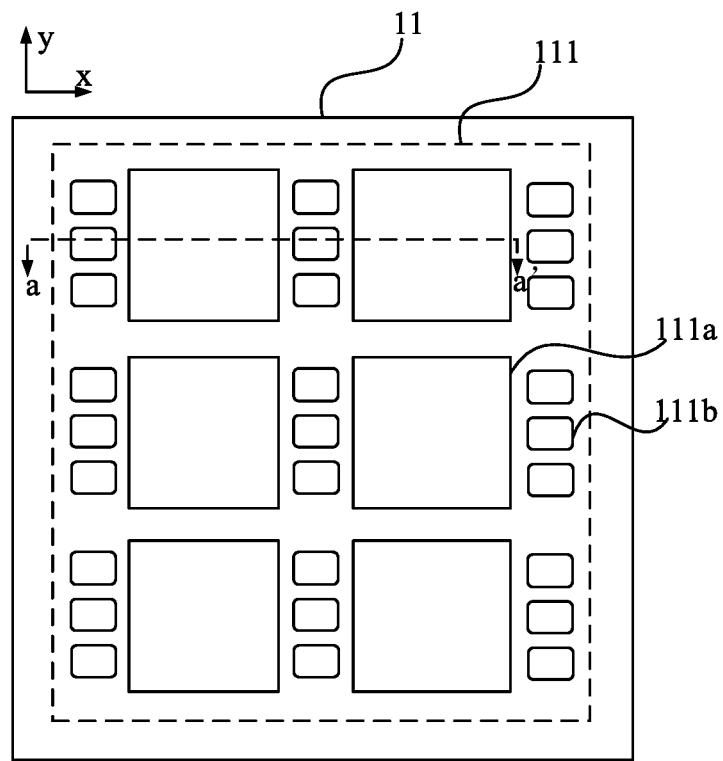
FIG. 1 is a structural diagram of a display panel according to an embodiment of the present disclosure.

Hereinafter the present disclosure will be further described in detail in conjunction with the drawings and embodiments. It is to be understood that the embodiments set forth below are intended to illustrate and not to limit the present disclosure. Additionally, it is to be noted that, for ease of description, only part, not all, of the structures related to the present disclosure are illustrated in the drawings.

A display panel for transparent display usually includes periodically arranged transparent regions. Generally, widths of the transparent regions range from a few micrometers to several tens of micrometers so that objects or images on a non-emissive side of the display panel are visible when external light passes through the multiple transparent regions. However, the periodically arranged transparent regions are equivalent to a grating with fixed grating intervals and slits and easily cause diffraction, affecting light-transmitting display. Additionally, the diffracted external light easily interferes with light from the display panel and distorts graphics in the display panel, affecting the display effect.

To solve the preceding problem, an embodiment of the present disclosure provides a display panel. The display panel includes a display area, a substrate and multiple first light-emitting elements.

The display area includes a transparent display region, where the transparent display region includes multiple transparent regions distributed in an array and multiple light-emitting regions disposed between adjacent transparent regions.

The multiple first light-emitting elements are located on one side of the substrate and in the multiple light-emitting regions.

In the transparent display region, film layers in at least two adjacent transparent regions have different thicknesses, and/or the film layers in the at least two adjacent transparent regions are made of different materials.

In this embodiment of the present disclosure, the display area of the display panel includes the transparent display region, where the transparent display region includes the multiple transparent regions distributed in an array and the multiple light-emitting regions disposed between the adjacent transparent regions for the purpose of transparent display, so that a user can view objects or images on a non-emissive side of the display panel. Specifically, the multiple first light-emitting elements are disposed on one side of the substrate, and the multiple first light-emitting elements are disposed in the multiple light-emitting regions for the purpose of light emission and display. In the transparent display region, film layers in the at least two adjacent transparent regions have different thicknesses or are made of different materials, or film layers in the at least two adjacent transparent regions have different thicknesses and are made of different materials. Thus, an optical path or a phase difference can be adjusted when external light passes through adjacent transparent regions, so that the multiple transparent regions arranged in an array are not to form a fixed grating. Then, it is difficult for the multiple transparent regions to diffract the external light ray for the reason of the periodic arrangement when the external light passes through the multiple transparent regions, enhancing the stability of the light-transmitting display of the display panel, preventing the display distortion of the display panel and enhancing the display effect.

Figure 2:
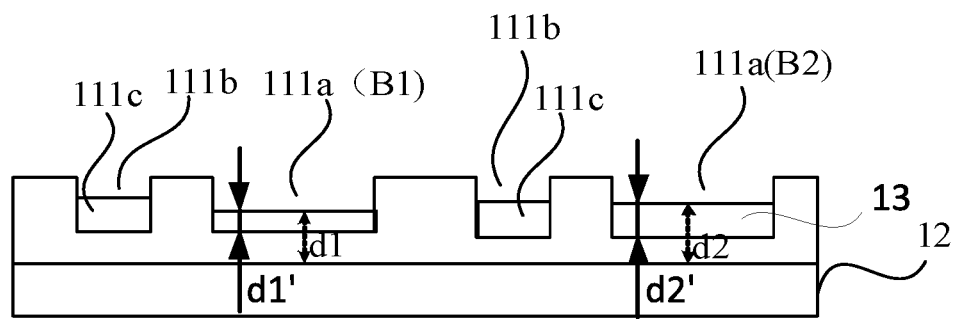
FIG. 2 is a sectional view of the display panel taken along a section line a-a' of FIG. 1.

FIG. 1 is a structural diagram of a display panel according to an embodiment of the present disclosure, and FIG. 2 is a sectional view of the display panel taken along section line a-a' of FIG. 1. As shown in FIG. 1, a display area 11 of the display panel includes a transparent display region 111, where the transparent display region 111 includes multiple transparent regions 111a arranged in an array and the multiple transparent regions 111a allow a user to view objects or images on a non-emissive side of the display panel. Moreover, the transparent display region 111 includes multiple light-emitting regions 111b disposed in regions between adjacent transparent regions 111a, so that the display panel can display images. Thus, the user can see objects or images in a viewing angle obstructed by the display panel when viewing images of the display panel, a transparent display panel is implemented and the user experience is improved. Referring to FIG. 2, along a direction perpendicular to the display panel, the display panel includes a substrate 12 and multiple first light-emitting elements 111c disposed on one side of the substrate 12 and in the multiple light-emitting regions 111b. Exemplarily, as shown in FIG. 2, the multiple light-emitting regions 111b are disposed in one-to-one correspondence with the multiple first light-emitting elements 111c. This example may include first light-emitting elements 111c of different colors, and similarly, the first light-emitting elements 111c may be arranged in an array in the transparent display region 111, so that images can be displayed through the first light-emitting elements 111c of different colors. In the transparent display region 111, at least two adjacent transparent regions 111a have different film thicknesses. It is to be noted that film layers of a light-transmitting region 111a mentioned here may refer to all film layers in the light-transmitting region 111a, or may refer to specific film layers in the light-transmitting region 111a. Exemplarily, for light-transmitting region B1 and light-transmitting region B2 disposed adjacent to each other, film thickness d1 of light-transmitting region B1 located on the substrate 12 is different from film thickness d2 of light-transmitting region B2 located on the substrate 12. This results in different optical paths and phase differences when external light passes through adjacent transparent regions, and reduces the diffraction of the external light that passes through the adjacent transparent regions, ensuring the effect of light-transmitting display and avoiding the display distortion of the display panel. From the light diffraction formula, when an optical path difference is an integral multiple of a wavelength, light is diffracted and forms dark fringes, and when the optical path difference is an integral multiple of half of the wavelength, light is diffracted and forms bright fringes. In this embodiment, the optical path of light incident on the multiple transparent regions is adjusted through an adjustment of a film thickness, so that the optical path difference of light between the adjacent transparent regions is not in the state of the bright fringes or the dark fringes, and this reduces the diffraction of the external light that passes through the multiple transparent regions. Similarly, to reduce the diffraction of the external light that passes through the multiple transparent regions, it is feasible to configure the at least two adjacent transparent regions 111a to have different film materials to change the optical path of the external light and reduce the diffraction. Alternatively, it is feasible to control the at least two adjacent transparent regions 111a to have different film thicknesses and different film materials to further prevent the diffraction.

Still referring to FIG. 2, the display panel may further include a first organic layer 13 located on one side of the substrate 12 facing to the multiple first light-emitting elements 111c. The first organic layer 13 is disposed at least in the transparent display region and has different thicknesses in at least two adjacent transparent regions. Exemplarily, as shown in FIG. 2, the first organic layer 13 has different thicknesses in two adjacent transparent regions 111a, where the first organic layer 13 has thickness d1' in light-transmitting region B1 and thickness d2' in light-transmitting region B2. The first organic layer 13 is disposed on one side of the substrate 12 facing to the multiple first light-emitting elements 111c and may cover the transparent display region. Certainly, the first organic layer 13 may be further disposed in other regions in addition to the transparent display region, which is not limited in this embodiment. Moreover, compared with an inorganic layer, the organic layer has a greater film thickness and is difficult to crack, and it is easy to dispose film layers of different thicknesses. The first organic layer 13 has different thicknesses in the at least two adjacent transparent regions and avoids the diffraction between adjacent transparent regions 111a of different thicknesses, reducing the diffraction in the whole transparent display region. In one embodiment, the preceding first organic layer 13 may refer to the substrate 12 and/or all organic film layers on one side of the substrate 12 facing to the multiple first light-emitting elements 111c, or may refer to at least one organic film on one side of the substrate 12 facing to the multiple first light-emitting elements 111c. The number of film layers in the first organic layer 13 is not limited in this embodiment.

In one embodiment, the first organic layer 13 may have random thicknesses in the multiple transparent regions 111a. Then, there is no regularity between the thicknesses in the multiple transparent regions 111a, and it is ensured that the first organic layer 13 has different thicknesses in any two adjacent transparent regions 111a. Therefore, external light are rarely diffracted in the multiple transparent regions 111a where the first organic layer 13 has random thicknesses, and the diffraction can be almost avoided for the display panel with the first organic layer 13 having random thicknesses in the multiple transparent regions 111a. This is an effective disposing of the first organic layer 13. It is to be noted that the "random" mentioned here can be understood as "be without no specific regularity". In an example in this embodiment, the first organic layer 13 has a different thickness in each light-transmitting region 111a, avoiding the diffraction completely and improving the display effect of the display panel.

In one embodiment, in the multiple transparent regions, the first organic layer may have thicknesses repeatedly configured according to a first variation period along a row direction and/or a column direction, where the first variation period includes n thickness values. The n thickness values increase progressively in the first variation period, where n denotes a positive integer and n≥3.

Figures 3, 4:
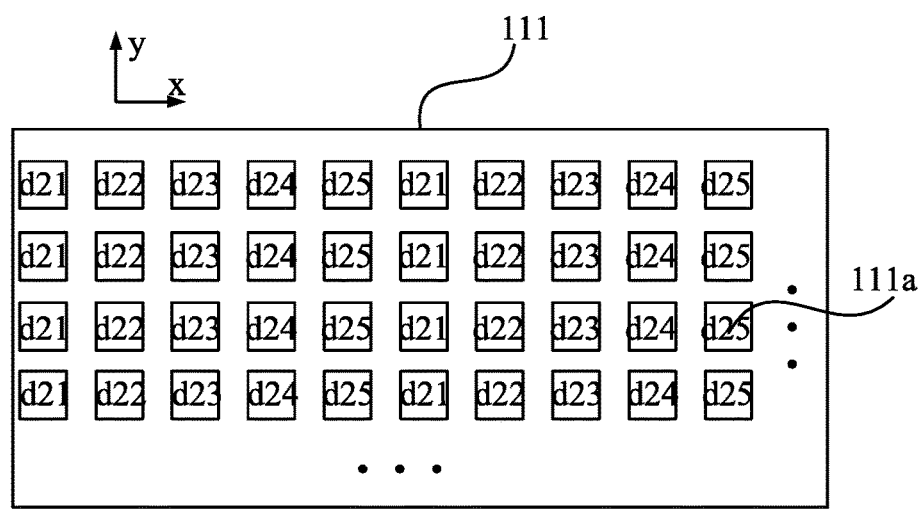
FIG. 3 is a structural diagram of multiple transparent regions arranged in an array according to an embodiment of the present disclosure.
FIG. 4 is a schematic diagram showing a configured period of thicknesses of a first organic layer in transparent regions according to an embodiment of the present disclosure.

FIG. 3 is a structural diagram of multiple transparent regions arranged in an array according to an embodiment of the present disclosure. As shown in FIG. 3, the multiple transparent regions 111a are arranged in an array in the transparent display region 111. Specifically, the multiple transparent regions 111a are sequentially arranged along the row direction x and sequentially arranged along the y direction. In this embodiment, the first organic layer 13 may be controlled to have thicknesses repeatedly configured according to a certain variation period in the multiple transparent regions 111a that are sequentially arranged along the row direction x. This can prevent the first organic layer 13 from having the same thickness in two adjacent transparent regions 111a to avoid the diffraction of the external light, and also helps dispose the first organic layer 13 in different transparent regions 111a according to a regularity and simplify a disposing process of the first organic layer 13. Similarly, the first organic layer 13 may be controlled to have thicknesses repeatedly configured according to a certain variation period in the multiple transparent regions 111a that are sequentially arranged along the column direction y. Additionally, the first organic layer 13 may be controlled to have thicknesses repeatedly configured according to a certain variation period in the multiple transparent regions 111a that are sequentially arranged along both the row direction x and the column direction y to further reduce the diffraction of the multiple transparent regions 111a. Specifically, in the multiple transparent regions 111a, the first organic layer 13 may have thicknesses repeatedly configured according to the first variation period along the row direction x and/or the column direction y, where the first variation period includes n thickness values. Then, along the row direction x and/or the column direction y, there are adjacent n transparent regions 111a in one-to-one correspondence with the n thickness values, and the first organic layer 13 in a next light-transmitting region 111a has the same thickness as the first organic layer 13 in the first light-transmitting region 111a of the preceding n transparent regions 111a. After that, this cycle is repeated until the thickness of the first organic layer 13 in the last light-transmitting region 111a of the row or column is configured. n may be an integer greater than or equal to 3 and has a value set according to the actual situation, as long as the first organic layer 13 is prevented from having the same thickness in transparent regions 111a facing to each other and results in the diffraction problem, avoiding the diffraction of the light regions 111a. The n thickness values increase progressively in the first variation period, helping configure the thicknesses of the first organic layer 13. FIG. 4 is a schematic diagram showing a configured period of thicknesses of a first organic layer in transparent regions according to an embodiment of the present disclosure. Exemplarily, as shown in FIG. 4, n=5, and in first variation period T1, thickness values of the first organic layer 13 in the multiple transparent regions 111a may be set sequentially as follows: d21=d+d*0%, d22=d+d*2%, d23=d+d*4%, d24=d+d*8% and d25=d+d*10%, where d denotes a preset initial thickness. Then, among the transparent regions 111a arranged along the row direction x, the first organic layer 13 has thickness d21 in the first light-transmitting region 111a, thickness d22 in the second light-transmitting region 111a, thickness d23 in the third light-transmitting region 111a, thickness d24 in the fourth light-transmitting region 111a, thickness d25 in the fifth light-transmitting region 111a, and thickness of d26 in the sixth light-transmitting region 111a. The cycle is repeated in this way so that the first organic layer 13 has different thicknesses in two adjacent transparent regions 111a along the row direction x, solving the diffraction problem.

In one embodiment, the n thickness values may be an arithmetic progression in the first variation period to help configure the thicknesses of the first organic layer 13 in different transparent regions 111a regularly and accurately, avoiding configuring a wrong thickness. The common difference value of the arithmetic progression may be selected according to implementation. In one embodiment, the n thickness values may be a geometric progression so that the first organic layer 13 has a greater thickness difference between two adjacent transparent regions 111a, which is not limited in this embodiment.

In one embodiment, in the multiple transparent regions, the first organic layer may have thicknesses repeatedly configured according to a second variation period along the row direction and/or the column direction. The second variation period includes a first sub-variation period and a second sub-variation period, and thickness values in the first sub-variation period are alternated with thickness values in the second sub-variation period in the second variation period. The first sub-variation period includes m1 thickness values, where the m1 thickness values increase progressively in the first sub-variation period; and the second sub-variation period includes m2 thickness values, where the m2 thickness values decrease progressively in the second sub-variation period. m1 and m2 denote positive integers, m1≥3 and m2≥3.

Figure 5:
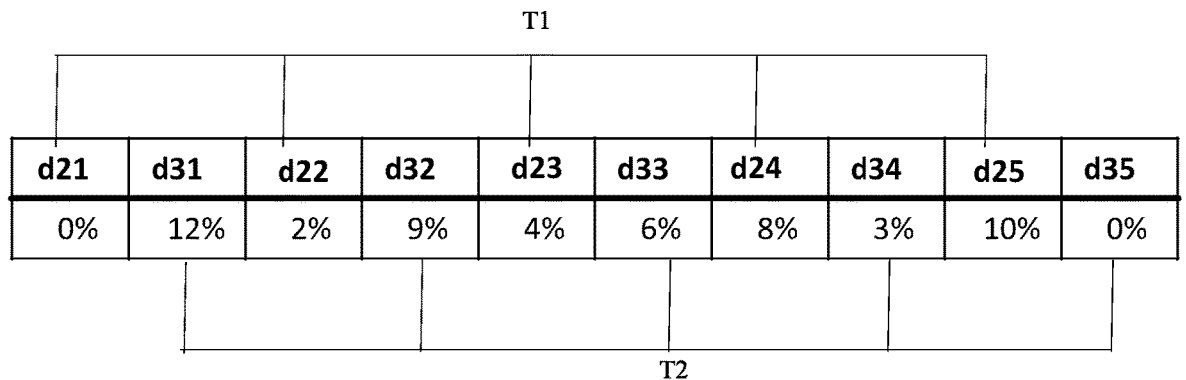
FIG. 5 is a schematic diagram showing another configured period of thicknesses of a first organic layer in transparent regions according to an embodiment of the present disclosure.

In the multiple transparent regions, the first organic layer may have thicknesses repeatedly configured according to the second variation period along the row direction x and/or the column direction y. FIG. 5 is a schematic diagram of another configured period of thicknesses of a first organic layer in transparent regions according to an embodiment of the present disclosure. As shown in FIG. 5, the second variation period may include first sub-variation period T1 and second sub-variation period T2, and thickness values in first sub-variation period T1 are alternated with thickness values in second sub-variation period T2 in the second variation period. First sub-variation period T1 includes m1 thickness values and second sub-variation period T2 includes m2 thickness values, and thus, the second variation period includes (m1+m2) thickness values and thickness values of the first organic layer in (m1+m2) adjacent transparent regions are configured in one-to-one correspondence with the (m1+m2) thickness values. Moreover, the m1 thickness values increase progressively in first sub-variation period T1 and the m2 thickness values decrease progressively in second sub-variation period T2, and thus the thickness values of the first organic layer in the (m1+m2) adjacent transparent regions first increase sequentially and then decrease gradually so that the disposing complexity of the first organic layer in the multiple transparent regions is increased and the diffraction is reduced. Exemplarily, as shown in FIG. 5, m1 and m2 each has a value of 5. In first sub-variation period T1, the m1 thickness values are set sequentially as follows: d21=d+d*0%, d22=d+d*2%, d23=d+d*4%, d24=d+d*8% and d25=d+d*10%; and in second sub-variation period T2, the m2 thickness values are set sequentially as follows: d31=d+d*12%, d32=d+d*9%, d33=d+d*6%, d34=d+d*3% and d35=d+d*0%, where d denotes a preset initial thickness. Thus, in the second variation period, thickness values of the first organic layer in the (m1+m2) adjacent transparent regions are sequentially d21, d22, d23, d24, d25, d31, d32, d33, d34 and d35, and this cycle is configured according to the second variation period.

In the preceding solution, first sub-variation period T1 and second sub-variation period T2 are sequentially configured in the second variation period. Continuing to refer to FIG. 5, In one embodiment, first sub-variation period T1 and second sub-variation T2 may be simultaneously configured. That is, along the row direction or the column direction, one thickness value in first sub-variation period T1 may be selected as the thickness of the first organic layer in the i-th light-transmitting region, and one thickness value in second sub-change period T2 may be selected as the thickness of the first organic layer in the (i+1)-th light-transmitting region. Exemplarily, in the second variation period, thickness values of the first organic layer in the (m1+m2) adjacent transparent regions are sequentially d21, d31, d22, d32, d23, d33, d24, d34, d25 and d35, and this cycle is configured according to the second variation period. If the m1 thickness values increase progressively but the m2 thickness values decrease progressively, then the first organic layer has a greater thickness difference between two adjacent transparent regions. For example, when the first organic layer has thicknesses d21 and d31 in adjacent transparent regions, where d21=d+d*0% and d31=d+d*12%, the first organic layer has a thickness difference up to d*12% that can effectively prevent the diffraction.

In one embodiment, in the multiple transparent regions arranged in an array, the first organic layer may have thicknesses repeatedly configured according to the first variation period in the j-th row of the multiple transparent regions, and have thicknesses repeatedly configured according to the second variation period in the (j+1)-th row of the multiple transparent regions. Alternatively, the first organic layer may have the thicknesses repeatedly configured according to the first variation period in the j-th column of the multiple transparent regions, and have the thicknesses repeatedly configured according to the second variation period in the (j+1)-th column of the multiple transparent regions. This increases the complexity of the thickness configuration of the first organic layer in the multiple transparent regions and reduces the diffraction.

In one embodiment, the m1 thickness values may be an arithmetic progression in first sub-variation period T1, and the m2 thickness values may be an arithmetic progression in second sub-variation period T2, where the arithmetic progression in first sub-variation period T1 has a different common difference than the arithmetic progression in second sub-variation period T2. It is easier to configure data of an arithmetic progression regularly and accurately, helping improve the accuracy of the thickness configuration of the first organic layer. Moreover, the arithmetic progression in first sub-variation period T1 has a different common difference than the arithmetic progression in second sub-variation period T2, so it is not easy for the thickness values in first sub-variation period T1 to be the same as the thickness values in second sub-variation period T2, further reducing the diffraction of the multiple transparent regions.

Figure 6:
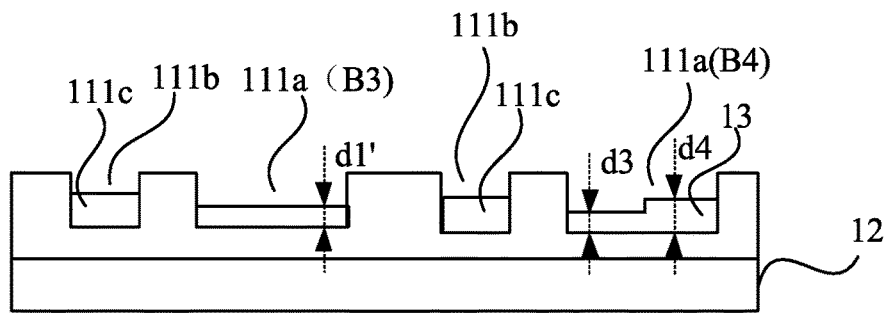
FIG. 6 is another sectional view of the display panel taken along a section line a-a' of FIG. 1.

FIG. 6 is another sectional view of the display panel taken along section line a-a' of FIG. 1. In one embodiment, referring to FIG. 6, the first organic layer 13 may have at least two different thicknesses in each light-transmitting region 111a. In the display panel shown in FIG. 2, the first organic layer 13 has different thicknesses in two adjacent transparent regions 111a, but has a constant thickness in the same light-transmitting region 111a. In contrast, in the example of FIG. 6, the first organic layer 13 may have the at least two different thicknesses in each light-transmitting region 111a. For example, the first organic layer 13 has thickness d1' in light-transmitting region B3, but has thicknesses d3 and d4 in light-transmitting region B4. It is feasible to control the optical path difference in the same light-transmitting region 111a to further reduce the diffraction of the multiple transparent regions.

Figure 7:
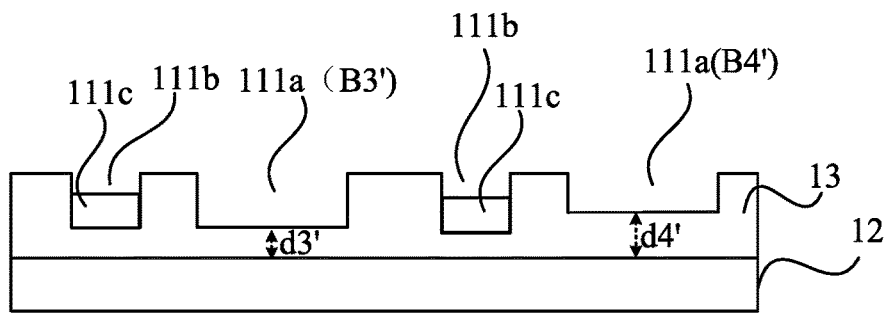
FIG. 7 is another sectional view of the display panel taken along a section line a-a' of FIG. 1.

FIG. 7 is another sectional view of the display panel taken along section line a-a' of FIG. 1. In one embodiment, referring to FIG. 7, the first organic layer 13 may include multiple grooves disposed in the multiple transparent regions 111a, and the first organic layer 13 has different thicknesses in at least two adjacent grooves.

The first organic layer 13 in the multiple transparent regions 111a may be formed by at least one layer of organic material that are stacked together or a planar organic material recessed. As shown in FIG. 7, when the first organic layer 13 is formed from the planar organic material recessed, the grooves are disposed in one-to-one correspondence with the multiple transparent regions 111a, the grooves are disposed in the multiple transparent regions 111a, and the first organic layer 13 has different thicknesses in adjacent grooves, that is, adjacent transparent regions 111a. As shown in FIG. 7, the first organic layer 13 has thickness d3' in light-transmitting region B3', and thickness d4' in light-transmitting region B4'; the first organic layer 13 has different thicknesses in adjacent grooves.

In one embodiment, the first organic layer 13 may be formed by using a half-tone mask, so that the regions, corresponding to the multiple transparent regions 111a, of the first organic layer 13 are directly masked to form the preceding grooves. The first organic layer 13 may also be formed in a coating manner, and the grooves may be formed in an etching or laser drilling manner. The forming process of the grooves is not limited in this embodiment.

Figure 8:
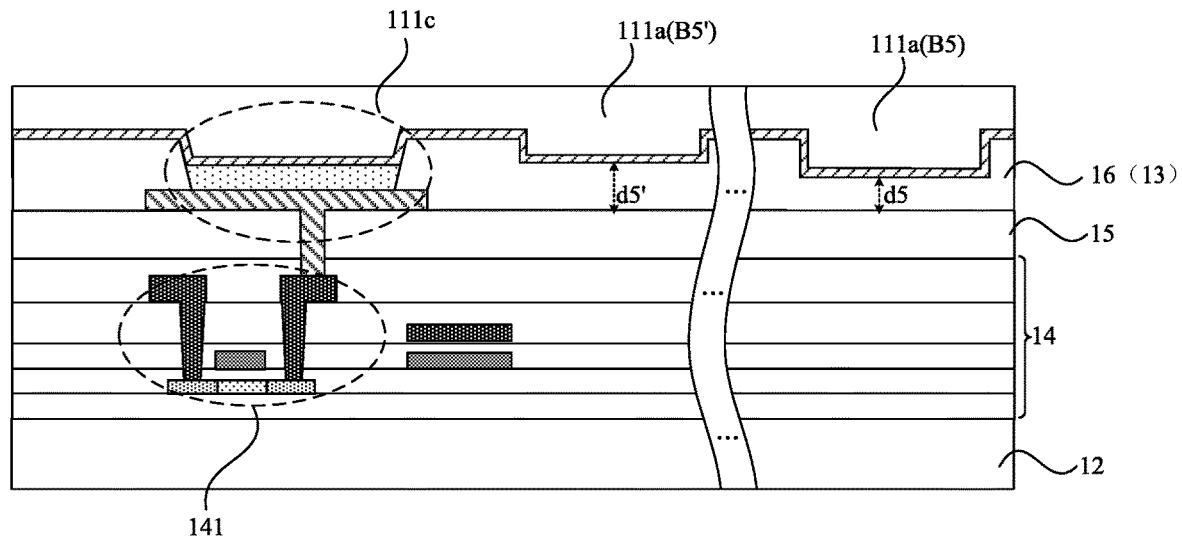
FIG. 8 is a partial sectional view of a display panel according to an embodiment of the present disclosure.

FIG. 8 is a sectional view of a display panel according to an embodiment of the present disclosure. In one embodiment, referring to FIG. 8, the display panel may further include a driving circuit layer 14, a planarization layer 15 and a pixel definition layer 16. The driving circuit layer 14 is disposed on one side of the substrate 12 facing to the multiple first light-emitting elements 111c. The planarization layer 15 is disposed on one side of the driving circuit layer 14 facing away from the substrate 12. The pixel definition layer 16 is disposed on one side of the planarization layer 15 facing away from the driving circuit layer 14 and is provided with multiple openings, where the multiple first light-emitting elements 111c are disposed in the multiple openings. The first organic layer 13 is the planarization layer 15 and/or the pixel definition layer 16.

Figure 9:
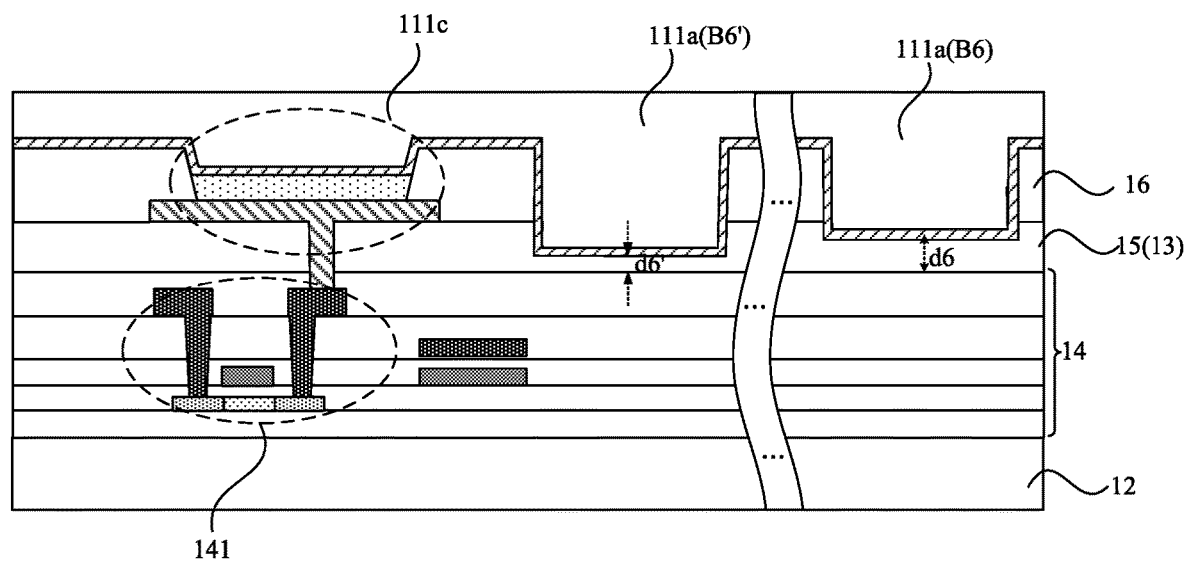
FIG. 9 is a partial sectional view of another display panel according to an embodiment of the present disclosure.

The driving circuit layer 14 is disposed between the substrate 12 and the multiple first light-emitting elements 111c and includes first driving circuits 141 arranged in an array. The first driving circuits 141 are disposed in one-to-one correspondence with the multiple first light-emitting elements 111c and configured to drive the corresponding first light-emitting elements 111c to emit light. The planarization layer 15 and the pixel definition layer 16 are further sequentially disposed between the driving circuit layer 14 and the multiple first light-emitting elements 111c. The planarization layer 15 planarizes the surface, on one side close to the multiple first light-emitting elements 111c, of the driving circuit layer 14. The pixel definition layer 16 is disposed between the driving circuit layer 14 and the multiple first light-emitting elements 111c and includes the multiple openings, where the multiple first light-emitting elements 111c are disposed in the multiple openings. The first organic layer 13 in the transparent display region may be the planarization layer 15 and/or the pixel definition layer 16. As shown in FIG. 8, the first organic layer 13 in the transparent display region is the pixel definition layer 16, and the first organic layer 13, that is, the pixel definition layer 16, has different thicknesses in different transparent regions 111a. Exemplarily, the first organic layer 13 has thickness d5 in light-transmitting region B5 and thickness d5' in adjacent light-transmitting region B5', where d5 has a different value than d5'. Then, the pixel definition layer 16 in the multiple transparent regions 111a may have different thicknesses than other parts of the transparent display region. The first organic layer 13 in the transparent display region may be the planarization layer 15. FIG. 9 is a sectional view of another display panel according to an embodiment of the present disclosure. As shown in FIG. 9, in the multiple transparent regions 111a, vias are formed in the pixel definition layer 16 and leaves exposed planarization layer 15, and the first organic layer 13, that is, the planarization layer 15, has different thicknesses in different transparent regions 111a. Exemplarily, the first organic layer 13 has thickness d6 in light-transmitting region B6 and thickness d6' in adjacent light-transmitting region B6', where d6 has a different than d6'. Then, the planarization layer 15 in the multiple transparent regions 111a may have different thicknesses than other parts of the transparent display region.

Figure 10:
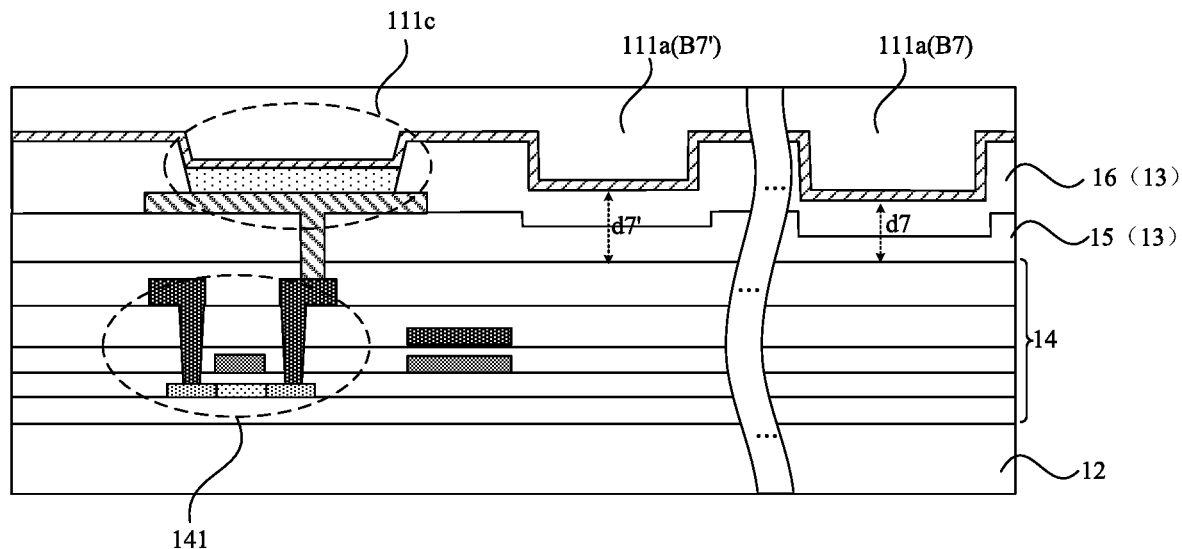
FIG. 10 is a partial sectional view of another display panel according to an embodiment of the present disclosure.

FIG. 10 is a sectional view of another display panel according to an embodiment of the present disclosure. In one embodiment, the first organic layer 13 may include both the planarization layer 15 and the pixel definition layer 16, and the first organic layer 13, that is, the planarization layer 15 and the pixel definition layer 16, has different thicknesses in different transparent regions 111a. Exemplarily, the first organic layer 13 has thickness d7 in light-transmitting region B7 and has thickness d7' in adjacent light-transmitting region B7', where d7 has a different value than d7'. Then, the planarization layer 15 in the multiple transparent regions 111a may have a different thickness than other parts of the transparent display region, and the pixel definition layer 16 in the multiple transparent regions 111a may have a different thickness than other parts of the transparent display region. In this way, the first organic layer 13 has more thickness selection intervals in the light transmission regions 111a, effectively reducing the diffraction.

In one embodiment, each first light-emitting element 111c may be an organic light-emitting element or a micro inorganic light-emitting element. Referring to FIGS. 8 to 10, each first light-emitting element 111c is the organic light-emitting element by way of example in this embodiment. Certainly, each first light-emitting element 111c may be the micro inorganic light-emitting element, and the specific element type of each first light-emitting element 111c is not limited in this embodiment.

Figure 11:
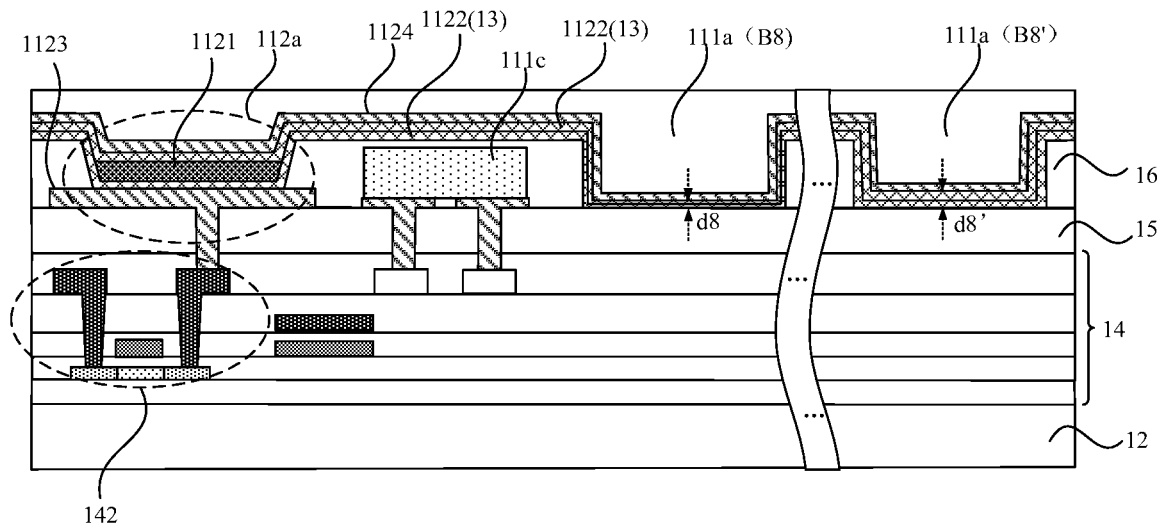
FIG. 11 is a partial sectional view of another display panel according to an embodiment of the present disclosure.

FIG. 11 is a sectional view of another display panel according to an embodiment of the present disclosure. In one embodiment, the display panel may further include multiple second light-emitting elements 112a, where each second light-emitting elements 112a is the organic light-emitting element and includes a light-emitting layer 1121 and an auxiliary light-emission function layer 1122, and the auxiliary light-emission function layer 1122 of at least one second light-emitting element 112a is made of the same material and disposed in the same layer as the first organic layer 13 disposed in at least one light-transmitting region 111a.

Figure 12:
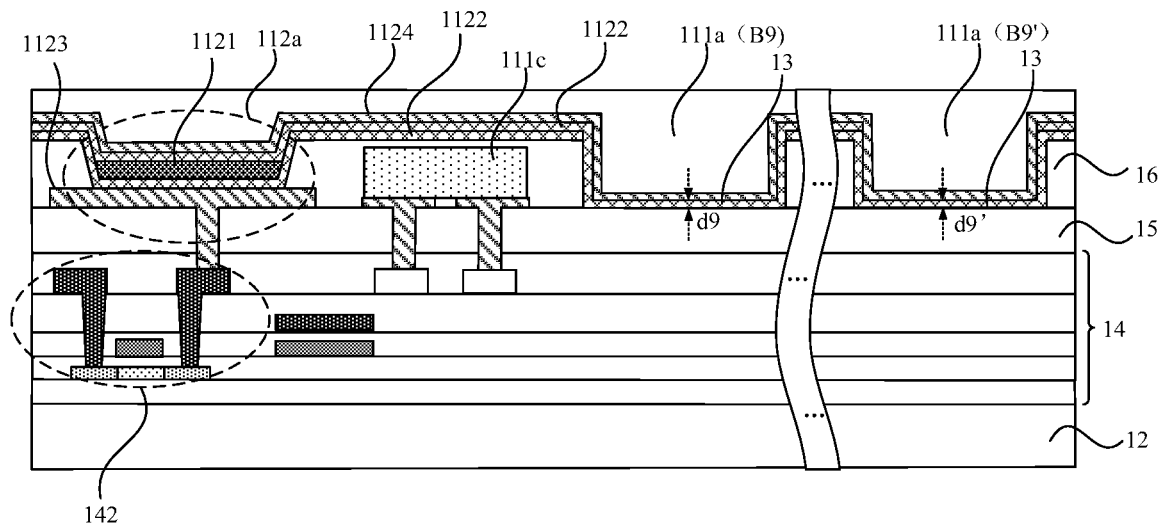
FIG. 12 is a partial sectional view of another display panel according to an embodiment of the present disclosure.

As shown in FIG. 11, the display panel may further include the multiple second light-emitting elements 112a, where each second light-emitting elements 112a is the organic light-emitting element that mainly includes a first electrode 1123, a light-emitting layer 1121 and a second electrode 1124. The light-emitting layer 1121 may be stimulated to emit light under the action of electrons and holes between the first electrode 1123 and the second electrode 1124 for the purpose of displaying images, and the first electrode 1123 and the second electrode 1124 transmit the holes and electrons to the light-emitting layer 1121 under the action of a voltage difference. The display panel may further include second driving circuits 142 in one-to-one correspondence with the multiple second light-emitting elements 112a, and the second driving circuits 142 are configured to provide operating voltages for the first electrode 1123 and the second electrode 1124. In order to accelerate the hole and electron transmission from the first electrode 1123 and the second electrode 1124 to the light-emitting layer 1121, each second light-emitting element 112a in this embodiment further includes the auxiliary light-emission function layer 1122 disposed on one side or both sides of the light-emitting layer 1121. The first organic layer 13 may be a film of the auxiliary light-emission function layer 1122 extending to the transparent display region, and the first organic layer 13 disposed in the at least one light-transmitting region 111a is disposed in the same layer and made of the same material as the auxiliary light-emission function layer 1122 of the at least one second light-emitting element 112a. That is, the first organic layer 13 disposed in the at least one light-transmitting region 111a may be formed from the auxiliary light-emission function layer 1122 extending to the transparent display region. Exemplarily, as shown in FIG. 12, the first organic layer 13 in light-transmitting region B8 is made of the same material, disposed in the same layer and have the same thickness as the auxiliary light-emission function layer 1122 of the at least one second light-emitting element 112a. In this example, the first organic layer 13 in light-transmitting region B8' adjacent to light-transmitting region B8 is made of the same material as the auxiliary light-emission function layer 1122, but thickness d8' of the first organic layer 13 in light-transmitting region B8' is different from thickness d8 of the first organic layer 13 in light-transmitting region B8.

FIG. 12 is a sectional view of another display panel according to an embodiment of the present disclosure. In one embodiment, the auxiliary light-emission function layer 1122 may include at least two of a hole injection layer, a hole transmission layer, an electron blocking layer, a hole blocking layer, an electron transmission layer and an electron injection layer. Each film layer of the first organic layer 13 in the multiple transparent regions 111a is made of the same material and disposed in the same layer as a respective film layer in the auxiliary light-emission function layer 1122. For film layers of the first organic layer 13 in at least two transparent regions 111a, the at least two transparent regions 111a have different film quantities.

In one embodiment, the first electrode 1123 may be an anode, the second electrode 1124 may be a cathode, the hole injection layer helps the hole overflow from the first electrode 1123, the hole transmission layer helps the hole transmission from the first electrode 1123 to the light-emitting layer 1121, and the electron blocking layer can block the transmission of electrons in the light-emitting layer 1121 along a direction toward the first electrode 1123. Between the first electrode 1123 and the light-emitting layer 1121, the hole injection layer, the hole transmission layer and the electron blocking layer may be sequentially disposed along the direction from the first electrode 1123 to the light-emitting layer 1121. Certainly, only at least one of the hole injection layer, the hole transmission layer and the electron blocking layer may be disposed, which is not limited in this embodiment. Similarly, the electron injection layer helps the electron overflow from the second electrode 1124, the electron transmission layer helps the electron transmission from the second electrode 1124 to the light-emitting layer 1121, and the hole blocking layer can block the transmission of holes in the light-emitting layer 1121 along a direction toward the second electrode 1124. Between the second electrode 1124 and the light-emitting layer 1121, the electron injection layer, the electron transmission layer and the hole blocking layer may be sequentially disposed along the direction from the second electrode 1124 to the light-emitting layer 1121. Certainly, only at least one of the electron injection layer, the electron transmission layer and the hole blocking layer may be disposed. The material of the first organic layer 13 in at least one light-transmitting region 111a is not completely the same as the material of the auxiliary light-emitting function layer 1122. Exemplarily, as shown in FIG. 12, the auxiliary light-emission function layer 1122 of each second light-emitting element 112a includes the auxiliary light-emission function layer 1122 between the first electrode 1123 and the light-transmitting layer 1121 and also includes the auxiliary light-emission function layer 1122 between the second electrode 1124 and the light-emitting layer 1121, but the first organic layer 13 in each light-transmitting region 111a may include only the auxiliary light-emission function layer 1122 between the second electrode 1124 and the light-transmitting layer 1121. As shown in FIG. 12, the first organic layer 13 in light-transmitting region B9 has thickness d9 and includes the auxiliary light-emission function layer 1122 between the second electrode 1124 and the light-transmitting layer 1121, and the first organic layer 13 in light-transmitting region B9' has thickness d9' and includes the auxiliary light-emission function layer 1122 between the first electrode 1123 and the light-transmitting layer 1121. The first organic layer 13 is made of different materials in light-transmitting region B9 and in light-transmitting region B9, and thickness d9 is different from thickness d9'. Exemplarily, if the auxiliary light-emission function layer 1122 of each light-emitting element includes the hole injection layer, the hole transmission layer, the electron injection layer and the electron transmission layer, then the first organic layer 13 includes two stacked film layers in at least one light-transmitting region 111a, where a first film is made of the same material and disposed in the same layer as the electron injection layer and a second film is made of the same material and disposed in the same layer as the electron transmission layer; and the first organic layer 13 includes three stacked film layers in at least another light-transmitting region 111a, where a first film layer is made of the same material and disposed in the same layer as the hole transmission layer, a second film is made of the same material and disposed in the same layer as the electron injection layer, and a third film is made of the same material and disposed in the same layer as the electron transmission layer. Film layers made of the same material as film layers in the auxiliary light-emission function layer 1122 are selectively disposed in different transparent regions 111a in a manner of same-layer manufacturing, so that the different transparent regions 111a has different film quantities, and this helps form the first organic layer 13 having different thicknesses. The same material for forming the portion of the first organic layer 13 and the auxiliary light-emission function layer is not limited in this embodiment It is to be noted that the first organic layer 13 may be formed by film layers in the auxiliary light-emission function layer 1122 extending to the transparent display region. That is, the auxiliary light-emission function layer 1122 and the first organic layer 13 form film layers covering the whole display region. Certainly, the first organic layer 13 may be disposed only in the multiple transparent regions 111a, and the auxiliary light-emission function layer 1122 may be disposed at the positions of the multiple second light-emitting elements 112a. That is, the auxiliary light-emission function layer 1122 and the first organic layer 13 are each arranged in an array in the display area. This saves the material costs of the first organic layer 13 and the auxiliary light-emission function layer 1122, and helps configure different thicknesses for the first organic layer 13 in the multiple transparent regions 111a.

Figure 13:
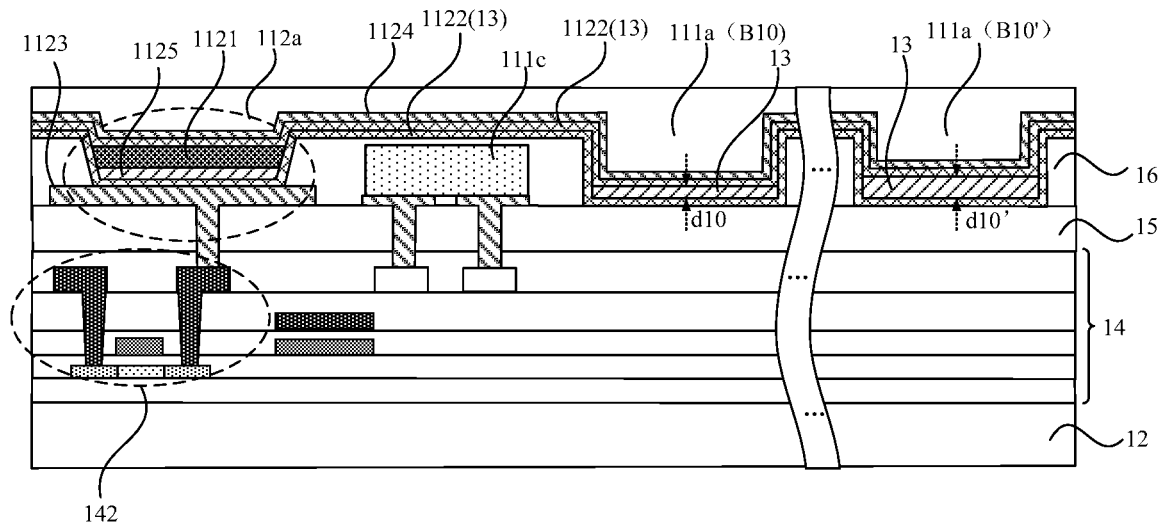
FIG. 13 is a partial sectional view of another display panel according to an embodiment of the present disclosure.

FIG. 13 is a sectional view of another display panel according to an embodiment of the present disclosure. In one embodiment, the display panel may further include multiple second light-emitting elements 112a, where each second light-emitting elements 112a is an organic light-emitting element and includes a first electrode 1123, a second electrode 1124, a light-emitting layer 1121 disposed between the first electrode 1123 and the second electrode 1124, and a light-emission compensation layer 1125 disposed between the first electrode 1123 and the light-emitting layer 1121. The multiple second light-emitting elements 112a include a first-color organic light-emitting element, a second-color organic light-emitting element and a third-color organic light-emitting element, where light-emission compensation layers 1125 of the first-color organic light-emitting element, the second-color organic light-emitting element and the third-color organic light-emitting element have different thicknesses. The first organic layer 13 disposed in at least one light-transmitting region 111a is made of the same material and has the same thickness as the light-emission compensation layer 1125 of the first-color organic light-emitting element. The first organic layer 13 disposed in at least another light-transmitting region 111a is made of the same material and has the same thickness as the light-emission compensation layer 1125 of the second-color organic light-emitting element. The first organic layer 13 disposed in at least another light-transmitting region 111s is made of the same material and has the same thickness as the light-emission compensation layer 1125 of the third-color organic light-emitting element.

The multiple second light-emitting elements 112a include the first-color organic light-emitting element, the second-color organic light-emitting element and the third-color organic light-emitting element. In one embodiment, a first color, a second color and a third color may be red, green and blue for the purpose of images display. A microcavity structure may be disposed in the organic light-emitting element to improve the light emission efficiency and the brightness of the organic light-emitting element. The microcavity structure is formed by multiple film layers between the first electrode 1123 and the second electrode 1124, and the thickness sum is the cavity length of the microcavity structure. The cavity length of the microcavity may be adjusted through thickness adjustments of film layer in the microcavity structure, so that the organic light-emitting element meets optical performance indicators. Organic light-emitting elements emitting light of different colors require different cavity lengths. In this embodiment, each second light-emitting element 112a may further include the light-emission compensation layer 1125 between the first electrode 1123 and the light-emitting layer 1121, and light-emission compensation layers 1125 of the organic light-emitting elements emitting light of different colors have different thicknesses. As shown in FIG. 13, if each second light-emitting element 112a further includes an auxiliary light-emission function layer 1122, the light-emission compensation layer 1125 may be disposed between the first electrode 1123 and the auxiliary light-emission function layer 1122, or may be disposed between the auxiliary light-emission function layer 1122 and the light-emitting layer 1121, which is not limited in this embodiment. In this embodiment, the first organic layer 13 is made of the same material and disposed in the same layer as the light-emission compensation layer 1125. The first organic layer 13 disposed in the at least one light-transmitting region 111a is made of the same material and has the same thickness as the light-emission compensation layer 1125 of the first-color organic light-emitting element. The first organic layer 13 disposed in the at least another light-transmitting region 111a is made of the same material and has the same thickness as the light-emission compensation layer 1125 of the second-color organic light-emitting element. The first organic layer 13 disposed in the at least another light-transmitting region 111s is made of the same material and has the same thickness as the light-emission compensation layer 1125 of the third-color organic light-emitting element. Moreover, the first organic layer 13 has different thicknesses in adjacent transparent regions 111a. This efficiently reduces the diffraction. Exemplarily, as shown in FIG. 13, the first organic layer 13 in light-transmitting region B10 is made of the same material and has the same thickness d10 as the light-emission compensation layer 1125 of one second light-emitting element, and the first organic layer 13 in light-transmitting region B10' adjacent to light-transmitting region B10 is made of the same material and has the same thickness d10' as the light-emission compensation layer 1125 of another second light-emitting element, where thickness d10 is different from thickness d10'.

Similarly, the first organic layer 13 may be disposed through the light-emission compensation layer 1125 extending to the transparent display region, or may be disposed only in the multiple transparent regions 111a, and the light-emission compensation layer 1125 may be disposed at the positions of the multiple second light-emitting elements 112a. That is, the light-emission compensation layer 1125 and the first organic layer 13 are each arranged in an array in the display area. This saves the material cost of the first organic layer 13 and the light-emission compensation layer 1125, and helps configure different thicknesses for the first organic layer 13 in the multiple transparent regions 111a.

In one embodiment, the first organic layer 13 may be formed in a printing manner. In one embodiment, the first organic layer 13 may be formed in an inkjet printing manner. Additionally, the preceding light-emission compensation layer 1125 and the auxiliary light-emission function layer 1122 may each be formed in a printing manner. The printing manner makes printed film layers uniform in thickness, saves the material and supports mass production, improving the production efficiency of the display panel. Additionally, when the preceding film layers are each arranged in an array in the display area, the printing manner can directly provide film blocks arranged in an array and avoid the process operations of etching, punching and the like during the forming of the film blocks, saving the manufacturing process. In this embodiment, the thicknesses of some regions of a printed film may be controlled through the size control of the droplets on a print head. This can configure different thicknesses for the first organic layer 13 and configure different thicknesses for the light-emission compensation layer 1125, and the operation is simple and accurate.

Figure 14:
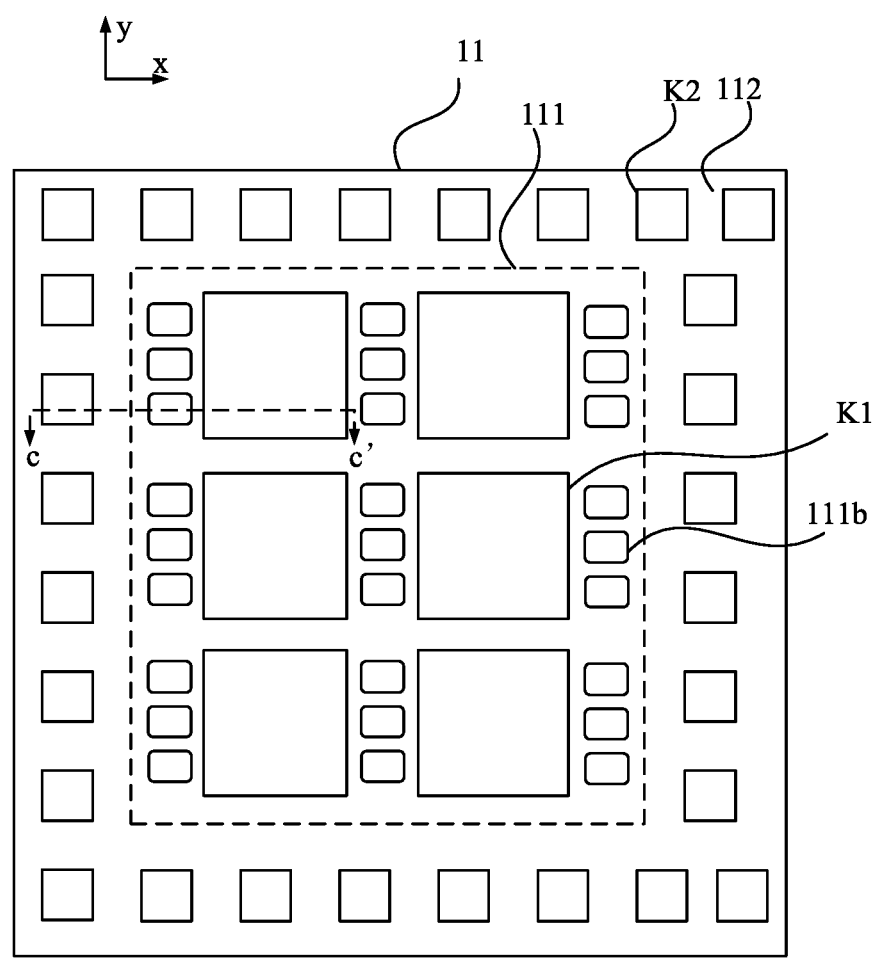
FIG. 14 is a structural diagram of another display panel according to an embodiment of the present disclosure.
Figure 15:
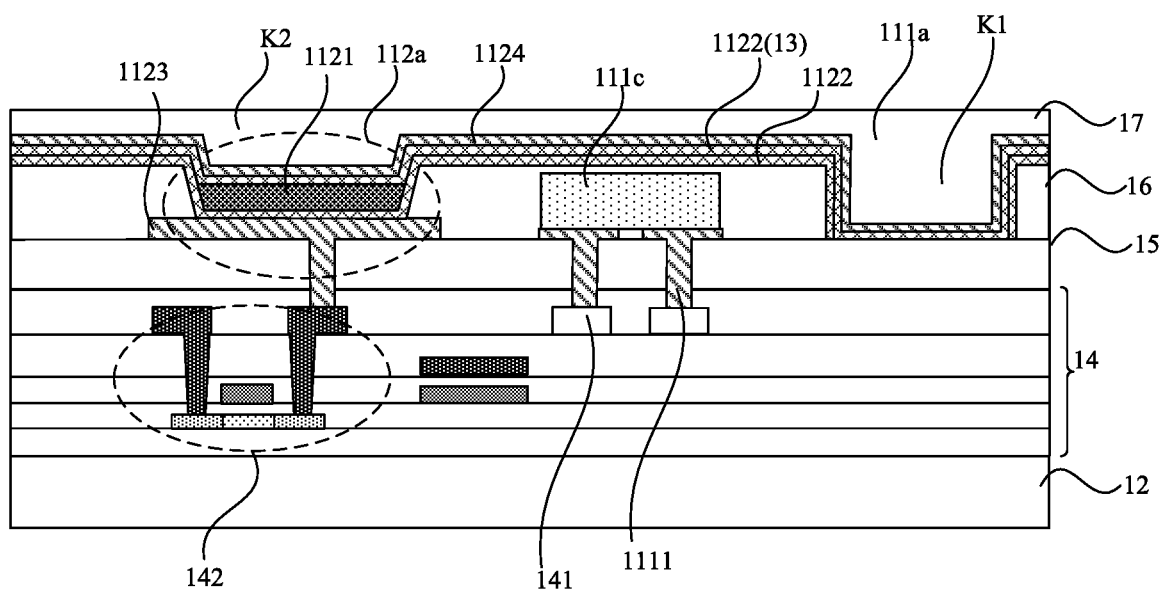
FIG. 15 is a sectional view of the display panel taken along a section line c-c' of FIG. 14.

FIG. 14 is a structural diagram of another display panel according to an embodiment of the present disclosure, and FIG. 15 is a sectional view of the display panel taken along section line c-c' of FIG. 14. In one embodiment, referring to FIGS. 14 and 15, the display panel may further include a pixel definition layer 16 provided with multiple first openings K1 and multiple second openings K2. The multiple first openings K1 are disposed in the multiple transparent regions 111a and the first organic layer 13 in the multiple transparent regions 111a is disposed in the multiple first openings K1, and the multiple second light-emitting elements 112a are disposed in the multiple second openings K2. The pixel definition layer 16 is made of a hydrophobic material.

Each second light-emitting element 112a of the display panel is an organic light-emitting element, and thus the pixel definition layer 16 needs to be provided with openings and first electrodes 1123 of the multiple second light-emitting elements 112a are exposed from the openings. The pixel definition layer 16 may be provided with the multiple second openings K2 in one-to-one correspondence with the multiple second light-emitting elements 112a, so that the multiple second light-emitting elements 112a are disposed in the multiple second openings K2. Moreover, the pixel definition layer 16 may be provided with the multiple first openings K1 in one-to-one correspondence with the multiple transparent regions 111a, so that the first organic layer 13 in the multiple transparent regions is disposed in the multiple first openings K1. In this embodiment, the pixel definition layer 16 is made of the hydrophobic material, and then it is easy to fix the auxiliary light-emission function layer 1122 and the first organic layer 13 at disposing positions during the forming of the auxiliary light-emission function layer 1122 and the first organic layer 13 in a printing manner, avoiding the overflow problem of the liquid material and improving the manufacturing accuracy of the auxiliary light-emission function layer 1122 and the first organic layer 13.

In one embodiment, continuing to refer to FIGS. 14 and 15, the transparent display region 111 may be a photosensor disposing region, the display area 11 further includes a conventional display region 112, and the display panel further includes multiple second light-emitting elements 112a disposed in the conventional display region. Each first light-emitting element 111c is a micro inorganic light-emitting diode, and each second light-emitting element 112a is an organic light-emitting diode.

The transparent display region 111 may be reused as the photosensor disposing region, and a photosensor such as a camera, a light sensor or the like may be disposed at a position corresponding to the photosensor disposing region on the non-emissive side of the display panel. This can meet the preceding photosensor disposing requirement without decreasing the area of the display area 11 and increase the screen-to-body ratio of the display panel, implementing a full-screen disposing of a display device. Exemplarily, as shown in FIG. 15, the conventional display region 112 may be disposed surrounding the transparent display region 111. Each second light-emitting element 112a in the conventional display region 112 is the organic light-emitting diode and used for the images display of the conventional display region 112. Each first light-emitting element 111c in the transparent display region 111 is the micro inorganic light-emitting diode with a much less size than the organic light-emitting diode in the conventional display region 112. The organic light-emitting diode occupies a smaller area while meeting the required resolution, increases the disposing area or the disposing quantity of the transparent regions 111a and enhances the perspective effect of the display panel, and enables the photosensor on the non-emissive side of the display panel to obtain strong perspective light, improving the measurement accuracy of the photosensor. For example, for the camera, the solution of this embodiment can improve the shooting definition and enhance the shooting experience.

In one embodiment, continuing to refer to FIG. 14 and FIG. 15, the display panel may further include a driving circuit layer 14, a planarization layer 15, a bonding layer 1111 of the micro inorganic light-emitting diode 1124, a pixel defining layer 16 and an organic layer. The driving circuit layer 14 includes an organic light-emitting diode driving circuit (a second driving circuit 142) in the conventional display region 112 and a micro inorganic light-emitting diode driving circuit (a first driving circuit that is not shown in FIG. 16) in the transparent display region 111. The planarization layer 15 is disposed on one side of the driving circuit layer 14 facing away from the substrate 12, where the organic light-emitting diode includes a first electrode 1123, a light-emitting layer 1121 and a second electrode 1124 that are stacked together, and the first electrode 1123 is disposed on one side of the planarization layer 15 facing away from the driving circuit layer 14. The bonding layer 1111 of the micro inorganic light-emitting diode is disposed on one side of the planarization layer 15 facing away from the driving circuit layer 14, where the micro inorganic light-emitting diode is bonded to the bonding layer 1111. The pixel defining layer 16 is disposed on one side of the micro inorganic light-emitting diode facing away from the bonding layer 1111 and is provided with first openings and second openings, where the first openings are disposed in the multiple transparent regions and first electrodes are partially exposed from the second openings. The organic layer and the light-emitting layer are disposed on one side of the pixel defining layer facing away from the first electrode, and the organic layer includes an auxiliary light-emission function layer 1122 of the organic light-emitting diode and a first organic layer 13 of the multiple transparent regions, where the auxiliary light-emission function layer 1122 and the light-emitting layer 1121 are disposed in the second openings K2 and the first organic layer 13 is disposed in the first openings. The first organic layer 13 has different thicknesses in at least part of the multiple transparent regions 111a.

Along a direction perpendicular to the display panel, the display panel sequentially includes the substrate 12, the driving circuit layer 14 and the planarization layer 15. The driving circuit layer 14 includes the first driving circuit for driving a first light-emitting element and the second driving circuit for driving a second light-emitting element. In this embodiment, the second light-emitting element is the organic light-emitting diode and the second driving circuit is the organic light-emitting diode driving circuit, and the first light-emitting element is the micro inorganic light-emitting diode and the first driving circuit is the micro inorganic light-emitting diode driving circuit. The planarization layer 15 is disposed on one side of the driving circuit layer 14 facing away from the substrate 12 and provides a flat substrate for disposing the first light-emitting element and the second light-emitting element.

First, the first electrode 1123 of the organic light-emitting diode and the bonding layer 1111 of the micro inorganic light-emitting diode may be formed on one side of the planarization layer 15 facing away from the substrate 12, and then, the crystal grains of the micro inorganic light-emitting diode are bonded to the bonding layer 1111. After the disposing of the micro inorganic light-emitting diode, the pixel defining layer 16 is disposed on one side of the micro inorganic light-emitting diode facing away from the bonding layer 1111 and includes the first openings K1 and the second openings K2. The first openings K1 are disposed in one-to-one correspondence with the multiple transparent regions 111a and are disposed in the multiple transparent regions 111a. The second openings K2 are disposed in one-to-one correspondence with the first electrodes 1123 and the first electrodes 1123 are partially exposed from the second openings K2. The auxiliary light-emission function layer 1122 and the light-emitting layer 1121 are disposed in the second openings K2, and the auxiliary light-emission function layer 1122 may extend to the whole conventional display region 112 to form the organic layer. The first organic layer 13 is disposed in the multiple transparent regions 111a and may extend to the whole transparent display region 111 to form the organic layer. Thus, the auxiliary light-emission function layer 1122 and the first organic layer 13 form the whole organic layer. Moreover, the first organic layer 13 has different thicknesses the at least part of the multiple transparent regions 111a, reducing the diffraction of the multiple transparent regions 111a.

Figure 16:
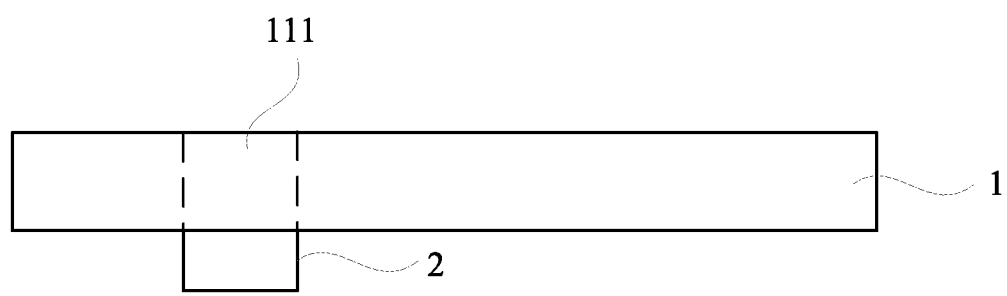
FIG. 16 is a structural diagram of a display device according to an embodiment of the present disclosure.

An embodiment of the present disclosure further provides a display device. FIG. 16 is a structural diagram of a display device according to an embodiment of the present disclosure. As shown in FIG. 16, the display device includes the display panel 1 of any embodiment of the present disclosure and a photosensor 2 disposed with respect to the transparent display region 111 of the display panel 1. The photosensor 2 may be a camera, a light sensor or the like.

The display device provided in this embodiment may be a mobile phone, or may be a computer, a television, a smart wearable device or the like, which is not specifically limited in the embodiment of the present disclosure.

Figure 17:
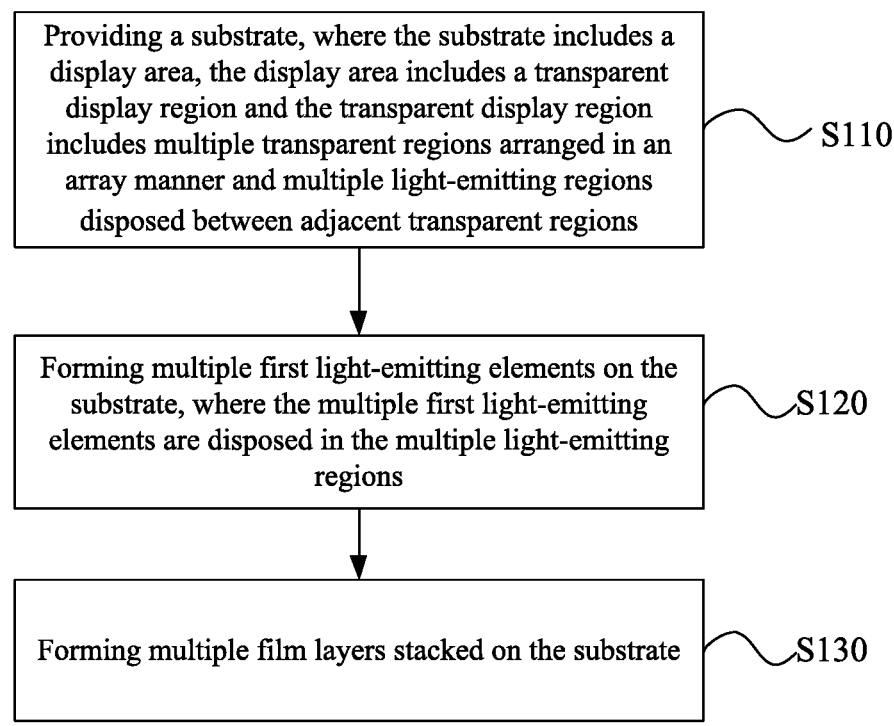
FIG. 17 is a flowchart of a manufacturing method of a display panel according to an embodiment of the present disclosure.
Figure 18:
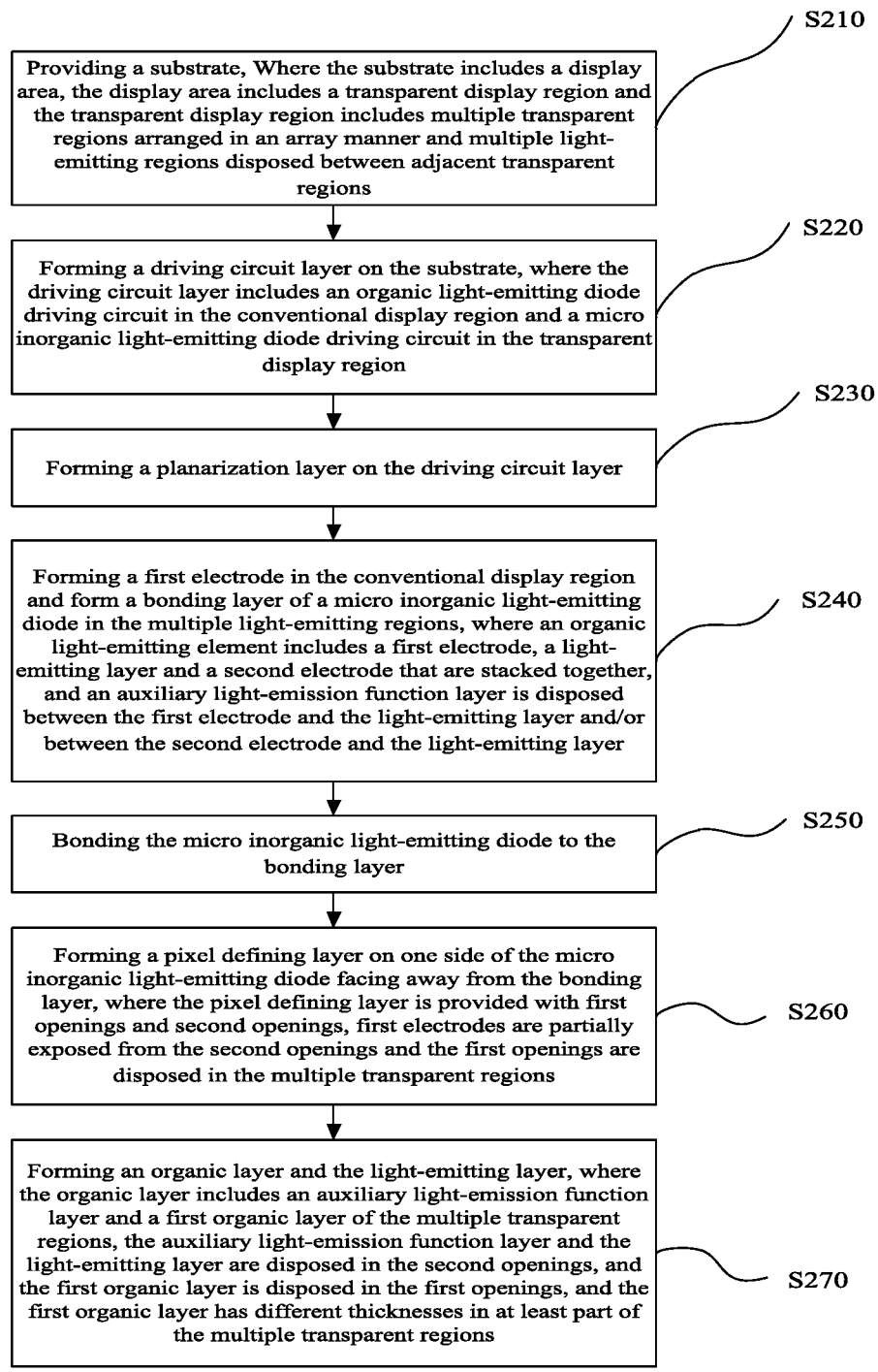
FIG. 18 is a flowchart of a manufacturing method of another display panel according to an embodiment of the present disclosure.

Based on the same inventive concept, an embodiment of the present disclosure further provides a manufacturing method of a display panel. FIG. 17 is a flowchart of a manufacturing method of a display panel according to an embodiment of the present disclosure. As shown in FIG. 17, this embodiment includes the steps described below.

In step S110, a substrate including a display area is provided, where the display area includes a transparent display region, and the transparent display region includes multiple transparent regions arranged in an array and multiple light-emitting regions disposed between adjacent transparent regions.

In step S120, multiple first light-emitting elements are formed on the substrate, where the multiple first light-emitting elements are disposed in the multiple light-emitting regions.

In step S130, multiple film layers stacked are formed on the substrate, where in the transparent display region, the film layers in at least two adjacent transparent regions have different thicknesses and/or the film layers in the at least two adjacent transparent regions are made of different film materials.

In this embodiment of the present disclosure, the display area of the display panel includes the transparent display region, where the transparent display region includes the multiple transparent regions distributed in an array and the multiple light-emitting regions disposed between the adjacent transparent regions for the purpose of transparent display, so that a user can view objects or images on a non-emissive side of the display panel. Specifically, the multiple first light-emitting elements are disposed on one side of the substrate and in the multiple light-emitting regions for the purpose of light emission and display. In the transparent display region, the film layers in the at least two adjacent transparent regions have different thicknesses or are made of different materials, or the film layers in the at least two adjacent transparent regions have different film materials thicknesses and different film materials. Thus, an optical path or a phase difference can be adjusted when external light passes through adjacent transparent regions, so that the multiple transparent regions arranged in an array are not to form a fixed grating. Then, it is difficult for the multiple transparent regions to diffract the external light ray for the reason of the periodic arrangement when the external light passes through the multiple transparent regions, enhancing the stability of the light-transmitting display of the display panel, preventing the display distortion of the display panel and enhancing the display effect.

Figure 19:
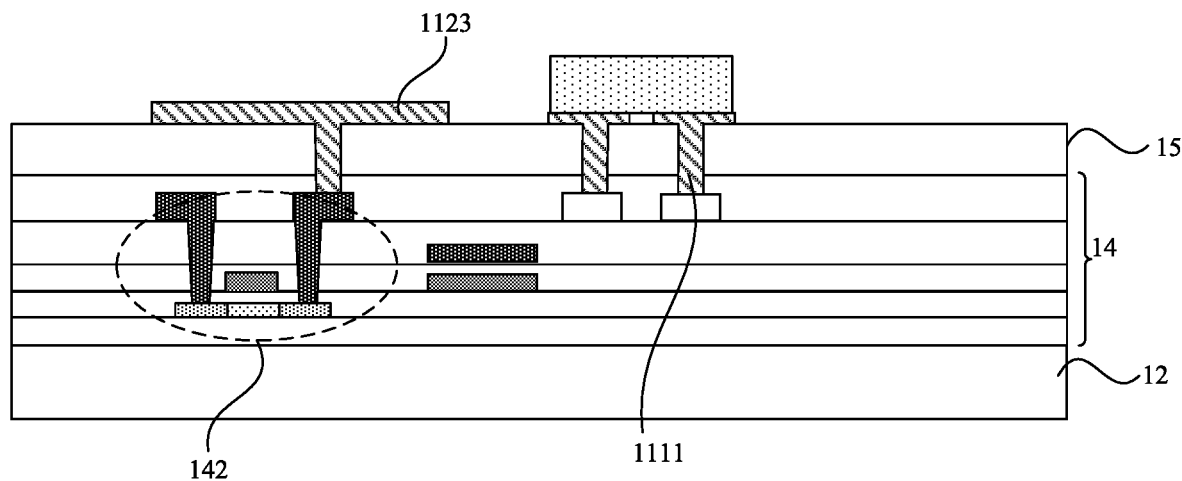
FIG. 19 is a structural diagram of a display panel after the forming of a first electrode and a bonding layer according to an embodiment of the present disclosure.

Based on the preceding embodiment, an embodiment of the present disclosure further provides a manufacturing method of a display panel. The display panel includes a transparent display region and a conventional display region. The transparent display region includes first light-emitting elements, and the conventional display region includes second light-emitting elements. Each first light-emitting element may be a micro inorganic light-emitting diode, and each second light-emitting element may be an organic light-emitting diode. FIG. 19 is a flowchart of a manufacturing method of another display panel according to an embodiment of the present disclosure, and the method of this embodiment includes the steps described below.

In step S210, a substrate including a display area is provided, where the display area includes the transparent display region and the transparent display region includes multiple transparent regions distributed in an array and multiple light-emitting regions disposed between adjacent transparent regions.

In step S220, a driving circuit layer is formed on the substrate, where the driving circuit layer includes an organic light-emitting diode driving circuit in the conventional display region and a micro inorganic light-emitting diode driving circuit in the transparent display region.

In step S230, a planarization layer is formed on the driving circuit layer.

In step S240, a first electrode is formed in the conventional display region and a bonding layer of a micro inorganic light-emitting diode is formed in the multiple light-emitting regions, where an organic light-emitting element includes a first electrode, a light-emitting layer and a second electrode that are stacked together, and an auxiliary light-emission function layer is disposed between the first electrode and the light-emitting layer and/or between the second electrode and the light-emitting layer.

FIG. 19 is a structural diagram of a display panel after the forming of a first electrode and a bonding layer according to an embodiment of the present disclosure. The first electrode 1123 and the bonding layer 1111 of the micro inorganic light-emitting diode are disposed on one side of the planarization layer 15 facing away from the driving circuit layer 14. The first electrode 1123 is electrically connected to a respective second driving circuit 142 through a via, and the bonding layer 1111 is electrically connected to first driving circuits through vias.

In step S250, the micro inorganic light-emitting diode is bonded to the bonding layer.

Continuing to refer to FIG. 19, the micro inorganic light-emitting diode is directly bonded to the bonding layer 1111, and the disposing of the first light-emitting elements is completed.

In step S260, a pixel defining layer is formed on one side of the micro inorganic light-emitting diode facing away from the bonding layer and is provided with first openings and second openings, where first electrodes are exposed from the second openings and the first openings are disposed in the multiple transparent regions.

Figure 20:
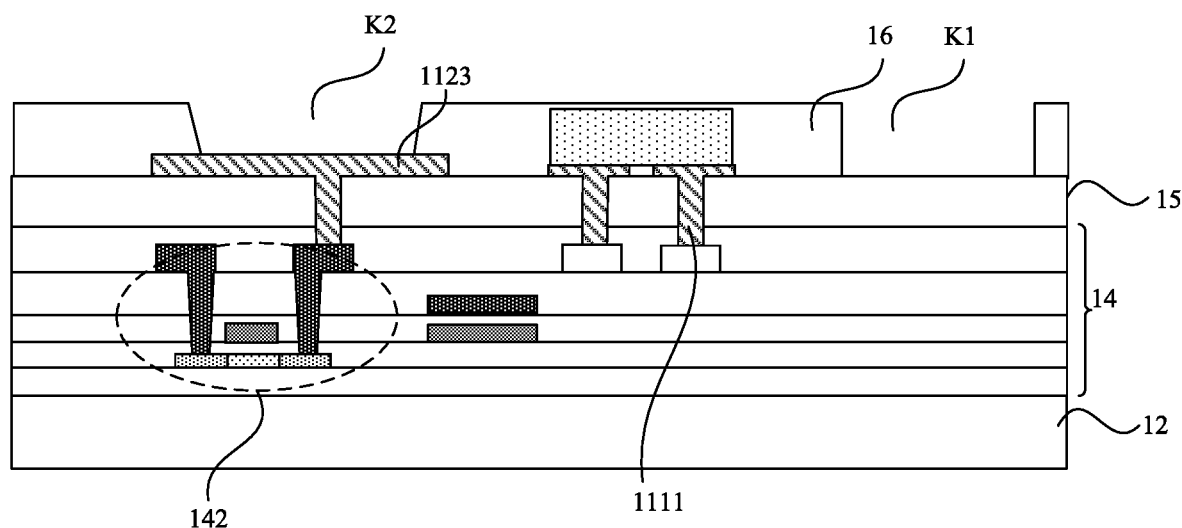
FIG. 20 is a structural diagram of a display panel after the forming of a pixel defining layer according to an embodiment of the present disclosure.

FIG. 20 is a structural diagram of a display panel after the forming of a pixel defining layer according to an embodiment of the present disclosure. The pixel defining layer 16 is provided with the first openings K1 and the second openings K2, where the first electrodes are partially exposed from the second openings K2 and the first openings K1 are disposed in the multiple transparent regions.

In step S270, an organic layer and the light-emitting layer are formed, where the organic layer includes an auxiliary light-emission function layer and a first organic layer of the multiple transparent regions. The auxiliary light-emission function layer and the light-emitting layer are disposed in the second openings, and the first organic layer is disposed in the first openings. The first organic layer has different thicknesses in at least part of the multiple transparent regions.

Figure 21:
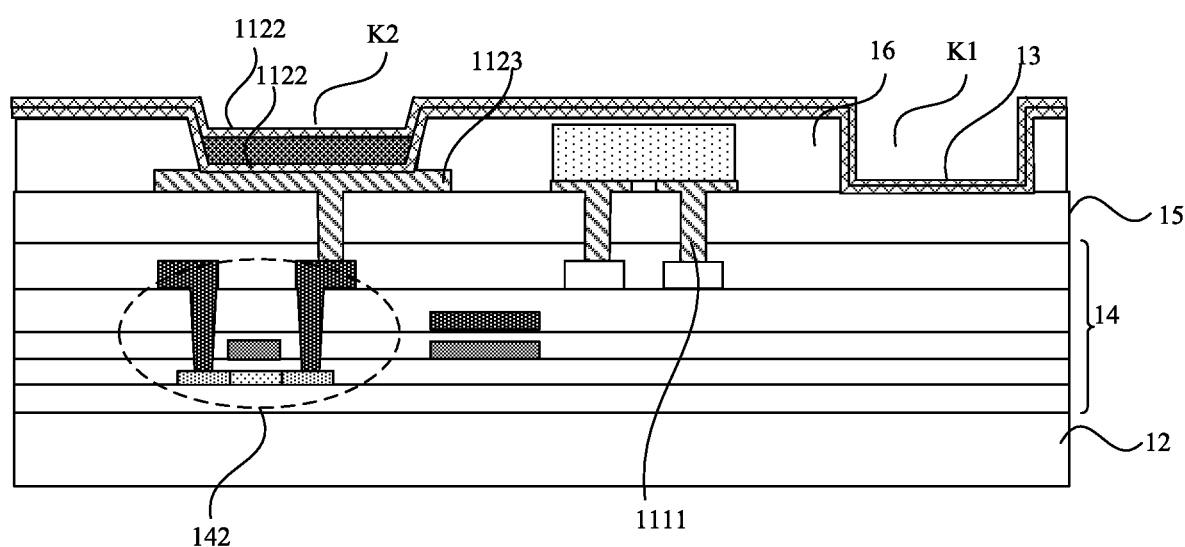
FIG. 21 is a structural diagram of a display panel after the forming of an organic layer and a light-emitting layer according to an embodiment of the present disclosure.

FIG. 21 is a structural diagram of a display panel after the forming of an organic layer and a light-emitting layer according to an embodiment of the present disclosure. The organic layer may include the auxiliary light-emission function layer 1122 between the first electrode 1123 and the light-emitting layer 1121, or may include the auxiliary light-emission function layer 1122 on one side of the light-emitting layer 1121 facing away from the first electrode 1123. The auxiliary light-emission function layer 1122 and the light-emitting layer 1121 are disposed in the second openings K2, and the first organic layer 13 is disposed in the first openings K1. The first organic layer 13 is made of the same material and disposed in the same layer as part of the auxiliary light-emission function layer 1122. Additionally, referring to FIG. 16, a second electrode 1124 may further be formed on the auxiliary light-emission function layer 1122, and a protective cover 17 may be disposed on the second electrode 1124 to form a complete display panel. In this example, the first organic layer 13 may be formed from the auxiliary light-emission function layer 1122 extending to the transparent display region. The first organic layer 13 may be disposed only in the first openings K1, and the auxiliary light-emission function layer 1122 may be disposed only in the second openings K2. That is, the first organic layer 13 is arranged in an array in the transparent display region, and the auxiliary light-emission function layer 1122 is arranged in an array in the conventional display region.

In this embodiment, micro inorganic light-emitting diodes are used as the first light-emitting elements, and the area of the multiple transparent regions is increased while the first light-emitting elements are configured in a same density as the second light-emitting elements is ensured, so that the transparent display region of the display panel has a better perspective effect. Moreover, the micro inorganic light-emitting diode can obtain a larger pixel density than the organic light-emitting diode on the premise of satisfying the perspective effect.

What is claimed is:

1. A display panel, comprising:
a display area, wherein the display area comprises a transparent display region, wherein the transparent display region comprises a plurality of transparent regions distributed in an array and a plurality of light-emitting regions, wherein each light-emitting region of the plurality of light-emitting regions is disposed between two adjacent transparent regions in the plurality of transparent regions;
a substrate, wherein the substrate comprises a first side and s second side disposed opposite the first side; and
a plurality of first light-emitting elements located on the first side of the substrate, and wherein the plurality of first light-emitting elements are disposed in the plurality of light-emitting regions,
wherein in the transparent display region, film layers in at least two adjacent transparent regions in the plurality of transparent regions have different thicknesses, and/or the film layers in the at least two adjacent transparent regions in the plurality of transparent regions are made of different materials.

2. The display panel of claim 1, further comprising:
a first organic layer disposed on the first side of the substrate facing to the plurality of first light-emitting elements, wherein the first organic layer is disposed at least in the transparent display region and has different thicknesses in the at least two adjacent transparent regions in the plurality of transparent regions.

3. The display panel of claim 2, wherein thicknesses of the first organic layer in the plurality of transparent regions follow a random distribution.

4. The display panel of claim 2, wherein thicknesses of the first organic layer in the plurality of transparent regions are repeatedly configured according to a first variation period along a row direction and/or a column direction, wherein the first variation period comprises n thickness values;
the n thickness values increase progressively in the first variation period, and n denotes a positive integer and n≥3.

5. The display panel of claim 4, wherein the n thickness values form an arithmetic progression in the first variation period.

6. The display panel of claim 2, wherein thicknesses of the first organic layer in the plurality of transparent regions are repeatedly configured according to a second variation period along a row direction and/or a column direction;
wherein the second variation period comprises a first sub-variation period and a second sub-variation period, and thickness values in the first sub-variation period and thickness values in the second sub-variation period are alternatively configured in the second variation period;
wherein the first sub-variation period comprises m1 thickness values, wherein the m1 thickness values increase progressively in the first sub-variation period;

wherein the second sub-variation period comprises m2 thickness values, wherein the m2 thickness values decrease progressively in the second sub-variation period; and wherein m1 and m2 denote positive integers, m1≥3 and m2≥3.

7. The display panel of claim 6, wherein
the m1 thickness values form an arithmetic progression in the first sub-variation period;
the m2 thickness values form an arithmetic progression in the second sub-variation period; and
wherein the arithmetic progression in the first sub-variation period has a different common difference than the arithmetic progression in the second sub-variation period.

8. The display panel of claim 2, wherein
the first organic layer has at least two different thicknesses in each of the plurality of transparent regions.

9. The display panel of claim 2, wherein
the first organic layer comprises a plurality of grooves disposed in the plurality of transparent regions; and
the first organic layer has different thicknesses in at least two adjacent grooves in the plurality of grooves.

10. The display panel of claim 9, further comprising:
a driving circuit layer disposed on the first side of the substrate facing to the plurality of first light-emitting elements;
a planarization layer disposed on one side of the driving circuit layer facing away from the substrate; and
a pixel defining layer disposed on one side of the planarization layer facing away from the driving circuit layer, wherein the pixel defining layer is provided with a plurality of openings, wherein the plurality of first light-emitting elements are disposed in the plurality of openings, wherein the first organic layer is the planarization layer and/or the pixel defining layer.

11. The display panel of claim 2, further comprising a plurality of second light-emitting elements, wherein each second light-emitting element of the plurality of second light-emitting elements is an organic light-emitting element and each second light-emitting element comprises a light-emitting layer and an auxiliary light-emitting function layer, and the auxiliary light-emitting function layer of at least one second light-emitting element of the plurality of second light-emitting elements and a portion of the first organic layer disposed in at least one of the plurality of transparent regions are made of a same material and disposed in a same layer.

12. The display panel of claim 11, wherein
the auxiliary light-emitting function layer comprises at least two of: a hole injection layer, a hole transmission layer, an electron blocking layer, a hole blocking layer, an electron transmission layer and an electron injection layer;
each film layer of the first organic layer in the plurality of transparent regions is made of a same material and disposed in a same layer as a respective film layer in the auxiliary light-emitting function layer; and
for each film layer of the first organic layer in at least two of the plurality of transparent regions, numbers of film layers in the at least two of the plurality of transparent regions are different.

13. The display panel of claim 2, further comprising a plurality of second light-emitting elements, wherein each second light-emitting element of the plurality of second light-emitting elements is an organic light-emitting element and each second light-emitting element comprises a first electrode, a second electrode, a light-emitting layer disposed between the first electrode and the second electrode, and a light-emitting compensation layer disposed between the first electrode and the light-emitting layer;
wherein the plurality of second light-emitting elements comprise a first-color organic light-emitting element, a second-color organic light-emitting element and a third-color organic light-emitting element, wherein the light-emitting compensation layer of the first-color organic light-emitting element, the light-emitting compensation layer of the second-color organic light-emitting element and the light-emitting compensation layer of the third-color organic light-emitting element have different thicknesses;
wherein a portion of the first organic layer located in at least one of the plurality of transparent regions and the light-emitting compensation layer of the first-color organic light-emitting element are made of a same material and have a same thickness;
wherein a portion of the first organic layer located in at least another one of the plurality of transparent regions and the light-emitting compensation layer of the second-color organic light-emitting element are made of a same material and have a same thickness; and
wherein a portion of the first organic layer located in at least another one of the plurality of transparent regions and the light-emitting compensation layer of the third-color organic light-emitting element are made of a same material and have a same thickness.

14. The display panel of claim 11, wherein
the first organic layer is formed by using a printing manner.

15. The display panel of claim 14, further comprising:
a pixel defining layer provided with a plurality of first openings and a plurality of second openings, wherein the plurality of first openings are disposed in the plurality of transparent regions and the first organic layer in the plurality of transparent regions is disposed in the plurality of first openings, and the plurality of second light-emitting elements are disposed in the plurality of second openings,
wherein the pixel defining layer is made of a hydrophobic material.

16. The display panel of claim 1, wherein
the transparent display region is a photosensor disposing region;
the display area further comprises a conventional display region;
wherein the display panel further comprises a plurality of second light-emitting elements disposed in the conventional display region; and
each of the plurality of first light-emitting elements is a micro inorganic light-emitting diode, and each of the plurality of second light-emitting elements is an organic light-emitting diode.

17. The display panel of claim 16, further comprising:
a driving circuit layer, wherein the driving circuit layer comprises an organic light-emitting diode driving circuit in the conventional display region and a micro inorganic light-emitting diode driving circuit in the transparent display region;
a planarization layer disposed on one side of the driving circuit layer facing away from the substrate, wherein the organic light-emitting diode comprises a first electrode, a light-emitting layer and a second electrode that are stacked, and wherein the first electrode is disposed on one side of the planarization layer facing away from the driving circuit layer;
a bonding layer of the micro inorganic light-emitting diode, wherein the bonding layer is disposed on the one side of the planarization layer facing away from the driving circuit layer, wherein the micro inorganic light-emitting diode is disposed on one side of the bonding layer facing away from the planarization layer, and the micro inorganic light-emitting diode is bonded to the bonding layer;
a pixel defining layer disposed on one side of the micro inorganic light-emitting diode facing away from the bonding layer, first openings and second openings are disposed in the pixel defining layer, wherein the first openings are disposed in the plurality of transparent regions and first electrodes are partially exposed from the second openings; and
an organic layer disposed on one side of the pixel defining layer facing away from the first electrode and the organic layer comprises an auxiliary light-emitting function layer of the organic light-emitting diode, which is disposed in the second openings and a first organic layer disposed in the first openings,
wherein the first organic layer has different thickness in at least part of the plurality of transparent regions.

18. A display device, comprising:
a display panel; and
a photosensor disposed with respect to a transparent display region of the display panel;
wherein the display panel comprises:
a display area, wherein the display area comprises a transparent display region, wherein the transparent display region comprises a plurality of transparent regions distributed in an array and a plurality of light-emitting regions, wherein each light-emitting region of the plurality of light-emitting regions is disposed between two adjacent transparent regions in the plurality of transparent regions;
a substrate, wherein the substrate comprises a first side and s second side disposed opposite the first side; and
a plurality of first light-emitting elements located on the first side of the substrate, and wherein the plurality of first light-emitting elements are disposed in the plurality of light-emitting regions,
wherein in the transparent display region, film layers in at least two adjacent transparent regions in the plurality of transparent regions have different thicknesses, and/or the film layers in the at least two adjacent transparent regions in the plurality of transparent regions are made of different materials.

19. A manufacturing method of a display panel, comprising:
providing a substrate, wherein the substrate comprises a display area, wherein the display area comprises a transparent display region and the transparent display region comprises a plurality of transparent regions distributed in an array and a plurality of light-emitting regions disposed between adjacent transparent regions in the plurality of transparent regions;
forming a plurality of first light-emitting elements on the substrate, wherein the plurality of first light-emitting elements are disposed in the plurality of light-emitting regions; and
forming a plurality of film layers stacked on the substrate,
wherein in the transparent display region, film layers of the plurality of film layers in at least two adjacent transparent regions in the plurality of transparent regions have different thicknesses, and/or the film layers of the plurality of film layers in the at least two adjacent transparent regions in the plurality of transparent regions are made of different materials.

* * * * *